(12) United States Patent
Berman

(10) Patent No.: US 10,818,351 B1
(45) Date of Patent: Oct. 27, 2020

(54) PHASE-CHANGE RANDOM ACCESS MEMORY (PRAM) WRITE DISTURB MITIGATION

(71) Applicant: SAMSUNG ELECTRONICS CO., LTD., Suwon-si, Gyeonggi-Do (KR)

(72) Inventor: Amit Berman, Ramat Gan (IL)

(73) Assignee: SAMSUNG ELECTRONICSC CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/388,092

(22) Filed: Apr. 18, 2019

(51) Int. Cl.
*G11C 13/00* (2006.01)
(52) U.S. Cl.
CPC ...... *G11C 13/0069* (2013.01); *G11C 13/0004* (2013.01); *G11C 2013/0092* (2013.01)
(58) Field of Classification Search
None
See application file for complete search history.

(56) References Cited

U.S. PATENT DOCUMENTS

2014/0325120 A1* 10/2014 Park ........... G11C 13/0069
711/103

* cited by examiner

*Primary Examiner* — James G Norman
(74) *Attorney, Agent, or Firm* — F. Chau & Associates, LLC

(57) ABSTRACT

A method for writing memory cells including: applying a program voltage to a target wordline; grounding bitlines of memory cells to be written to a first resistance state; setting a bitline voltage of unselected bitlines; and setting a wordline voltage of unselected wordlines; applying the program voltage to a target bitline; grounding wordlines of the memory cells to be written to a second resistance state; setting the wordline voltage of the unselected wordlines to a first value if a peak of a maximum voltage drop is greater than or equal to a second value; otherwise, setting the wordline voltage to zero; and setting the bitline voltage of the unselected bitlines to a third value if the peak of the maximum voltage drop is greater than or equal to the second value; otherwise, setting the bitline voltage to zero.

20 Claims, 12 Drawing Sheets

FIG. 4B

| Alpha | BL Voltage Coefficient | WL Voltage Coefficient | BL Voltage For Vpp = 2V | WL Voltage For Vpp = 2V | BL Voltage For Vpp = 3V | WL Voltage For Vpp = 3V |
|---|---|---|---|---|---|---|
| 0.00 | 0.00 | 0.00 | 0.00 | 0.00 | 0.00 | 0.00 |
| 0.05 | 0.00 | 0.00 | 0.00 | 0.00 | 0.00 | 0.00 |
| 0.10 | 0.00 | 0.00 | 0.00 | 0.00 | 0.00 | 0.00 |
| 0.15 | 0.00 | 0.00 | 0.00 | 0.00 | 0.00 | 0.00 |
| 0.20 | 0.00 | 0.00 | 0.00 | 0.00 | 0.00 | 0.00 |
| 0.25 | 0.00 | 0.00 | 0.00 | 0.00 | 0.00 | 0.00 |
| 0.30 | 0.33 | 0.65 | 0.65 | 1.30 | 0.98 | 1.95 |
| 0.35 | 0.30 | 0.60 | 0.60 | 1.20 | 0.90 | 1.80 |
| 0.40 | 0.28 | 0.55 | 0.55 | 1.10 | 0.83 | 1.65 |
| 0.45 | 0.25 | 0.50 | 0.50 | 1.00 | 0.75 | 1.50 |
| 0.50 | 0.23 | 0.45 | 0.45 | 0.90 | 0.68 | 1.35 |
| 0.55 | 0.20 | 0.40 | 0.40 | 0.80 | 0.60 | 1.20 |
| 0.60 | 0.18 | 0.35 | 0.35 | 0.70 | 0.53 | 1.05 |
| 0.65 | 0.15 | 0.30 | 0.30 | 0.60 | 0.45 | 0.90 |
| 0.70 | 0.13 | 0.25 | 0.25 | 0.50 | 0.38 | 0.75 |
| 0.75 | 0.10 | 0.20 | 0.20 | 0.40 | 0.30 | 0.60 |
| 0.80 | 0.08 | 0.15 | 0.15 | 0.30 | 0.23 | 0.45 |
| 0.85 | 0.05 | 0.10 | 0.10 | 0.20 | 0.15 | 0.30 |
| 0.90 | 0.03 | 0.06 | 0.06 | 0.12 | 0.09 | 0.18 |
| 0.95 | 0.03 | 0.06 | 0.06 | 0.12 | 0.09 | 0.18 |
| 1.00 | | | | | | |

FIG. 8

| | Improvement over V/2 | | Improvement over V/3 | |
|---|---|---|---|---|
| | Write Disturb | Power | Write Disturb | Power |
| Algorithm 1, alpha=1/2 | -50% | -70% | -25% | -80% |
| Algorithm 2 | -66% | -55% | -50% | -70% |

PHASE-CHANGE RANDOM ACCESS MEMORY (PRAM) WRITE DISTURB MITIGATION

TECHNICAL FIELD

Exemplary embodiments of the present inventive concept relate to write methods of nonvolatile memory devices, and more particularly, to a nonvolatile memory device write method with reduced write disturbs.

DISCUSSION OF RELATED ART

Phase-change random access memory (PRAM) has improved scaling potential compared to traditional memory technologies. In order to obtain small feature size and enable capacity through vertical stacks, proper vertical three-dimensional architecture is required. Cross-point structures, where separate wordline and bitline wire bars (or planes as in V-PRAM) are connected with variable-resistance materials, are able to exploit PRAM's inherent characteristics and take advantage of process vertical buildup while tolerating high temperatures. However, the cross-point construction raises reliability and power consumption challenges.

Write disturb phenomenon occurs in cross-point formation when applying a write voltage for target cells. Since all cells in a row share the same wordline, the potential is applied to every cell. In a SET operation (e.g., setting low-resistance by positive top-to-bottom electrodes) cells that are meant to be changed have a ground connection in their associated bitline. Cells that have to retain their resistance shell have a bitline voltage that minimizes their voltage drop which causes disturb. If the bitlines in those cells are set to write voltage, their voltage drop and disturb reduces to zero. However, corresponding cells that are located in the same bitline and unselected wordlines now have write potential in their bottom electrode, requiring their wordline voltage to be the same which leads to setting low-resistance in unselected cells.

Conventional write schemes tackle write voltage disturbs by V/2 or V/3 settings. In V/2, the unselected wordlines and bitlines are biased with half of a write voltage. FIG. 1A demonstrates such a configuration with a 5×5 array matrix. Wordline (WL) rows are placed above the bitlines (BL) and each intersection connects WL to BL within a PRAM device. The centered cell is meant to be written and is marked with a full circle. The unfilled circles are cells that are affected by write disturb. Cells that share a bitline with written cells and cells on the same wordline that are not meant to be written have voltage drop disturb at V/2 magnitude. Due to limited SET/RESET endurance cycles, and since efficient error-correction schemes exist for a binary symmetric channel, it can be assumed that data would be scrambled to binary IID Bernoulli-1/2 probability for each bit. In this case, nearly half of each wordline contains high-resistance cells and therefore about half of an array matrix would suffer from right disturb. In V/3, unselected wordlines are biased with V/3 and unselected bitlines with 2V/3, as shown in FIG. 1B. This approach is to reduce the voltage's disturb magnitude to |V/3| but nearly all array cells are affected, both in a single bit flip and random wordline data distribution (unwanted cells in the same row as a written cell are biased with +V/3, other cells in different wordlines are affected by −V/3).

SUMMARY

According to an exemplary embodiment of the present inventive concept, there is provided a method for writing memory cells in a nonvolatile memory device comprising wordlines overlapping bitlines, the method comprising: in a first phase: applying a program pulse voltage to a target wordline; grounding bitlines of memory cells to be written to a first resistance state; setting a bitline voltage of unselected bitlines; and setting a wordline voltage of unselected wordlines; in a second phase: applying the program pulse voltage to a target bitline; grounding wordlines of the memory cells to be written to a second resistance state; setting the wordline voltage of the unselected wordlines to a first value if a peak of a maximum voltage drop over memory cells which were not meant to be changed is greater than or equal to a second value, and setting the wordline voltage to zero if the peak of the maximum voltage drop is not greater than or equal to the second value; and setting the bitline voltage of the unselected bitlines to a third value if the peak of the maximum voltage drop is greater than or equal to the second value, and setting the bitline voltage to zero if the peak of the maximum voltage drop is not greater than or equal to the second value.

The first phase is a set phase and the second phase is a reset phase.

The nonvolatile memory device is phase-change random access memory.

The first resistance state is a low resistance state the second resistance state is a high resistance state.

The wordlines and the bitlines form an M×N array, wherein M and N are each integers greater than one, and wherein the bitline voltage of the unselected bitlines is represented by $$V_{BL} = \frac{2}{M+1} V_{PP},$$

where $V_{BL}$ is the bitline voltage of the unselected bitlines and $V_{PP}$ is the program pulse voltage.

The wordlines and the bitlines form an M×N array, wherein M and N are each integers greater than one, and wherein the wordline voltage of the unselected wordlines is represented by $$V_{WL} = \frac{1}{M+1} V_{PP},$$

where $V_{WL}$ is the wordline voltage of the unselected bitlines and $V_{PP}$ is the program pulse voltage.

The first value is (0.9965-0.9934α) multiplied by the program pulse voltage, wherein α is a value between zero and one.

The third value is (0.4982-0.4967α) multiplied by the program pulse voltage, wherein α is a value between zero and one.

The second value is the program pulse voltage divided by 3.

According to an exemplary embodiment of the present inventive concept, there is provided a method for writing memory cells in a nonvolatile memory device comprising wordlines overlapping bitlines, the method comprising: in a first phase: applying a program pulse voltage to a target wordline; grounding bitlines of memory cells to be written to a first resistance state; grounding unselected bitlines and wordlines; in a second phase: applying the program pulse voltage to a target bitline; grounding wordlines of the memory cells to be written to a second resistance state;

setting a wordline voltage of the unselected wordlines; and setting a bitline voltage of the unselected bitlines.

The first phase is a set phase and the second phase is a reset phase.

The nonvolatile memory device is phase-change random access memory.

The first resistance state is a low resistance state the second resistance state is a high resistance state.

The wordline voltage is represented by $$V_{WL} = \frac{2V_{PP}}{3},$$

where $V_{WL}$ is the wordline voltage and $V_{PP}$ is the program pulse voltage.

The bitline voltage is represented by $$V_{BL} = \frac{V_{PP}}{3},$$

where $V_{BL}$ is the bitline voltage and $V_{PP}$ is the program pulse voltage.

According to an exemplary embodiment of the present inventive concept, there is provided a method for writing memory cells in a nonvolatile memory device comprising wordlines overlapping bitlines, the method comprising: applying a program pulse voltage to a target wordline; grounding bitlines of memory cells to be written to a first resistance state; setting a bitline voltage of unselected bitlines; setting a wordline voltage of unselected wordlines; applying the program pulse voltage to a target bitline; grounding wordlines of the memory cells to be written to a second resistance state; and setting the wordline voltage of the unselected wordlines to a first value if a peak maximum voltage drop of memory cells which were not meant to be changed is greater than or equal to a second value.

The method further comprises setting the wordline voltage to zero if the peak maximum voltage drop is not greater than or equal to the second value.

The method further comprises setting the bitline voltage of the unselected bitlines to a third value if the peak maximum voltage drop is greater than or equal to the second value.

The method further comprises setting the bitline voltage to zero if the peak maximum voltage drop is not greater than or equal to the second value.

The nonvolatile memory device is phase-change random access memory.

BRIEF DESCRIPTION OF THE FIGURES

The above and other features of the present inventive concept will become apparent from the following description taken in conjunction with the accompanying figures in which:

FIG. 4B is additional tabular data for FIG. 4A;

FIG. 8 illustrates gain difference between algorithms 1 and 2 and write schemes of V/2 and V/3.

Figure 1A:
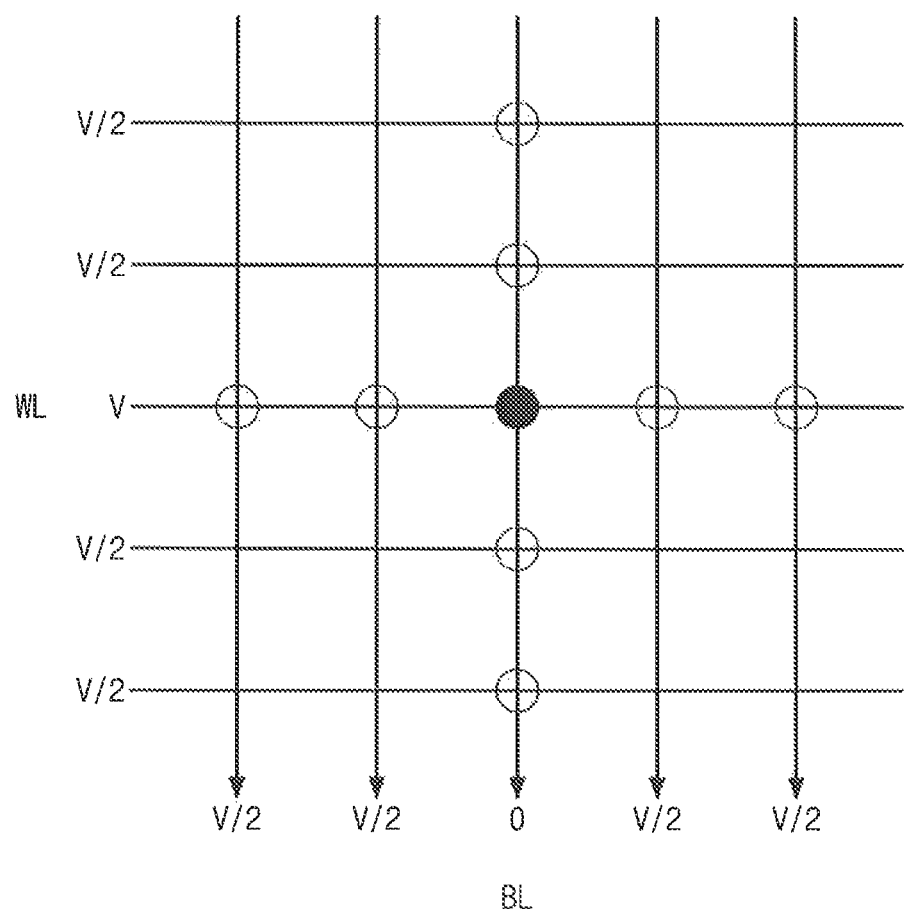
FIG. 1A illustrates a conventional write scheme.
Figure 1B:
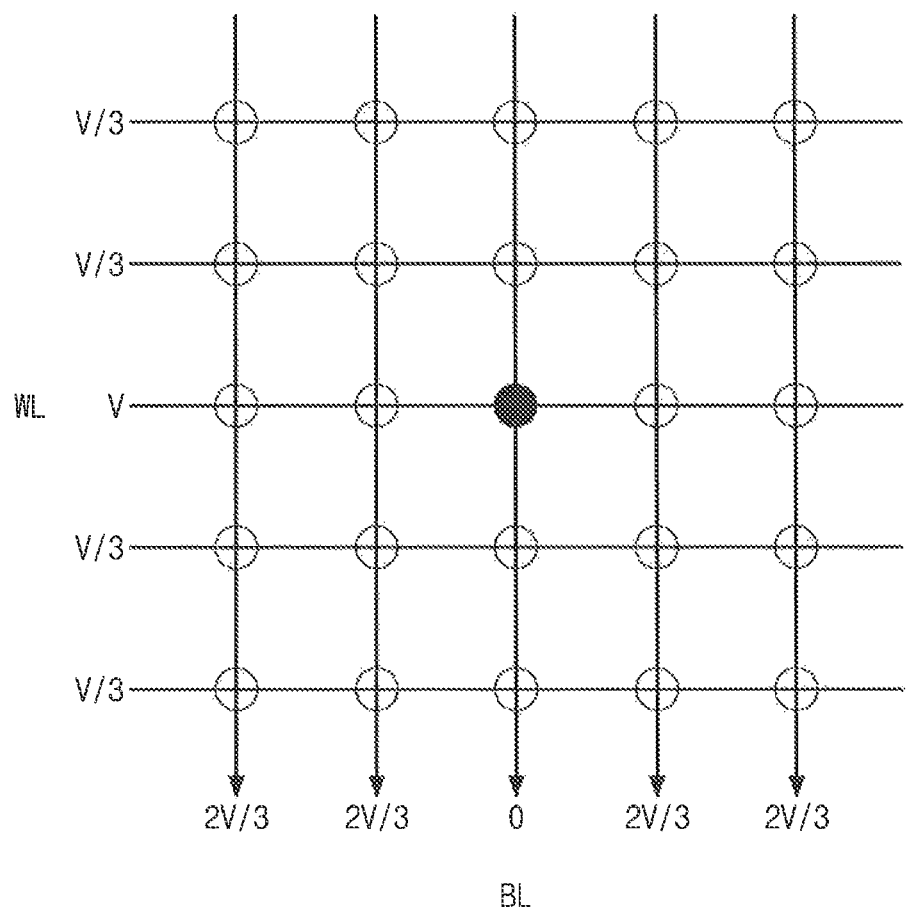
FIG. 1B illustrates another conventional write scheme.

It is to be understood that the values in the figures are provided for reference example, and thus, the inventive concept is not limited thereto.

DETAILED DESCRIPTION OF THE EMBODIMENTS

In accordance with an exemplary embodiment of the inventive concept, there is provided a write algorithm that can reduce voltage disturb and leakage power dissipation, thereby enabling reliability and reducing cost.

Hereinafter, power consumption and disturb of a phase-change random access memory (PRAM) cross-point matrix as a function or wordline/bitline voltages is modeled, and power optimization with constrained peak voltage per cell is performed. The power-efficient write algorithm according to an exemplary embodiment of the inventive concept is then presented.

Constrained Power-Optimized Write Operation

A. Notations

Notation 1 (Write operation in M×N array matrix): the memory cell array is marked to have M rows and N columns. Each write operation is done in wordline granularity and has two steps: first set the low-resistance states (positive wordline-to-bitline voltage) and second write to high-resistance cells. This write order is referred to as SET-before-RESET, which the reverse order is RESET-before-SET.

Notation 2 (Program pulse voltage): the voltage magnitude that is required for a program (SET write, low resistance state—LRS) pulse is denoted with $V_{PP}$ or simply V. The negative voltage with the same value is used for RESET (setting high resistance state—HRS).

Notation 3 (Unselected wordline/bitline votlage): the applied potential for unselected wordlines and bitlines is marked with $V_{WL}$ and $V_{BL}$. The abbreviations for wordline and bitline are WL and BL, respectively.

Notation 4 (Redundant power dissipation): when performing a write operation, unwanted voltage drops (marked $V_U$) may apply on memory cells that are not meant to be changed. This voltage multiplied by the resulting current through the device $I_U$ is referred to as redundant power dissipation during write and denoted with $P_U$. For the set $S=\{V_{U1}, V_{U2}, \dots\}$ of different possible $V_U$ values and for each resistance $R_j$ out of $R=\{R_0, R_1, \dots, R_{L-1}\}$, the number of corresponding affected cells is denoted $G(V_{th}, R_j)$. Therefore, $P_U$ is:

$$P_U(S, R) = \sum_{V_{Ui} \in S} \left( \sum_{R_j \in R} I_{Ui}(R_j) V_{Ui} \cdot G(V_{Ui}, R_j) \right) = \sum_{V_{Ui} \in S} \left( \sum_{R_j \in R} \frac{V_{Ui}^2}{R_j} \cdot G(V_{Ui}, R_j) \right)$$

It is to be assumed that data is randomized to binary IID Bernoulli-1/2 distribution, and therefore the number of cells with voltage drop $V_{th}$ (denoted $G(V_{Ui})$) is scattered equally among resistance levels: $G(V_{Ui})/L$ cells for each level. In a memory array that occupies cells with L levels:

$$P_U(S) = \frac{R_{eq}}{L} \sum_{V_{Ui} \in S} (V_{Ui}^2 \cdot G(V_{Ui}))$$

$$R_{eg} = 1 \Big/ \left( \frac{1}{R_0} + \frac{1}{R_1} + \ldots + \frac{1}{R_{L-1}} \right)$$

The constant $R_{eq}/L$ does not depend on the write algorithm and thus would be assigned the value of 1 for normalization.

Notation 5 (Maximal voltage disturb): the maximum voltage drop over an array cell that was not meant to be changed is denoted with $V_{MD}$:

$$V_{MD}(S) = \max(S) = \max\{V_{U1}, V_{U2}, \ldots\}$$

Notation 6 (Cell disturb and array size constraints): wordline write can tolerate a limited amount of resistance drift caused by voltage disturb. Therefore, the maximal voltage drop over cells which were not meant to be changed is constrained by up to $V_{PEAK}$. Memory array size is limited by the peak of redundant power dissipation, denoted with $P_{PEAK}$. Clearly:

$$V_{PEAK} \geq V_{MD}(S)$$

$$P_{PEAK} \geq P_U(S)$$

The constraints depend on each other as would be noted when performing power and disturb optimization.

B. Electric Model of Write Operation

Figure 2:
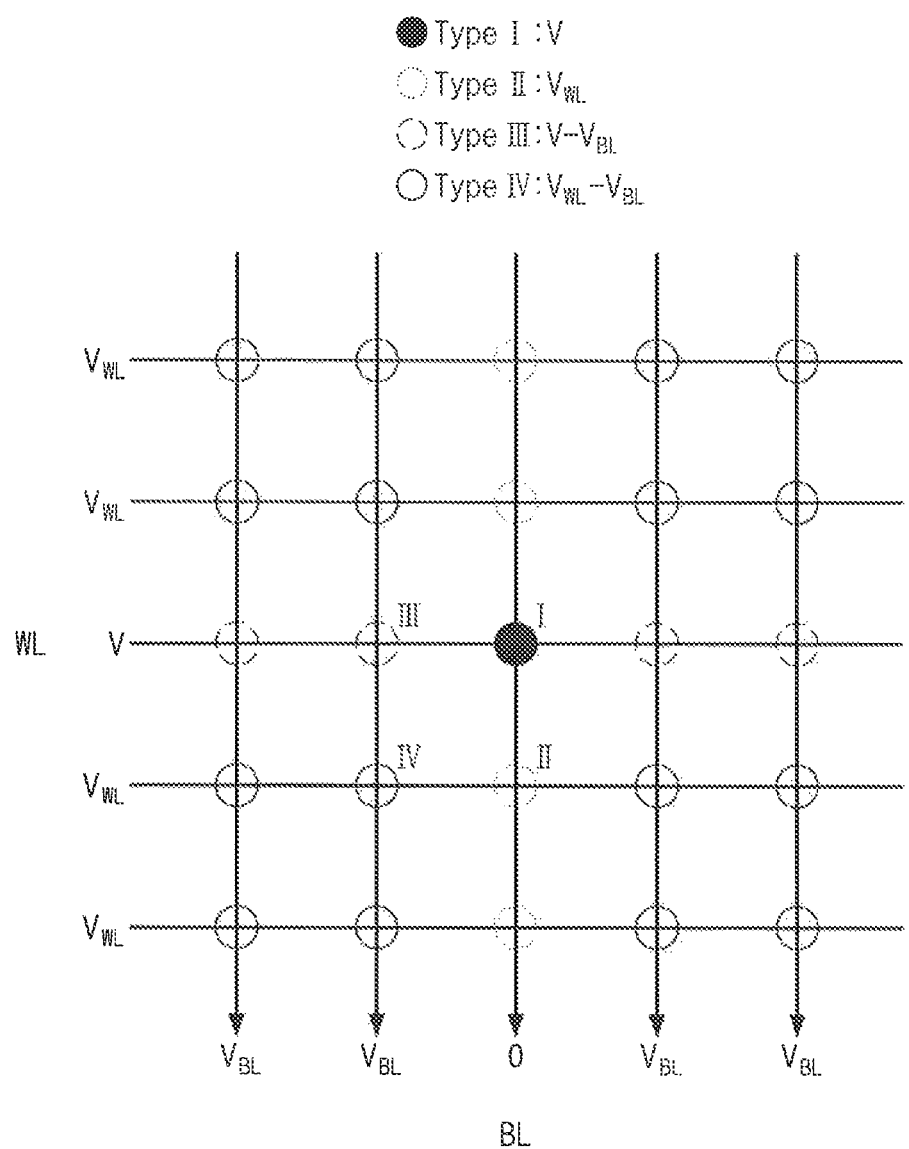
FIG. 2 illustrates parametric modeling of array cell voltage-drops during a write operation in cross-point phase-change random access memory (PRAM), according to an exemplary embodiment of the inventive concept.

In a SET operation, a target wordline is biased with $V_{PP}(V)$ and bitlines of cells that are meant to be written to LRS are grounded. The unselected WL/BL are assigned with $V_{WL}/V_{BL}$ parameters as shown in FIG. 2. In a RESET operation, the same voltages are assigned while replacing WL to BL and vice-versa (in writing cells to HRS in the same wordline).

FIG. 2 illustrates parametric modeling of array cell voltage-drops during a write operation in cross-point phase-change random access memory (PRAM), according to an exemplary embodiment of the inventive concept. The selected cells to be SET to LRS are with voltage drop V, and variables $V_{WL}/V_{BL}$ are assigned to unselected wordlines and bitlines. Analysis shows that there are four types for voltage drops on array cells: I. Target cells with V; II. Cells that are on the same bitline with target written cells are with voltage drop $V_{WL}$; III. Cells that are on the same wordline with written cells are $V-V_{BL}$ and IV. Cells that do not belong to one of the previous groups get $V_{WL}-V_{BL}$ voltage drop. The RESET process has similar analysis.

Observing the framework of voltage drops on array cells, there are four possibilities:

I. Target cells to LRS $$V_1 = V_{PP}$$

II. Cells that share the same bitline with target LRS cell $$V_2 = V_{WL}$$

III. Cells on the target WL that are meant for HRS $$V_3 = V_{PP} - V_{BL}$$

IV. Other cells that do not share WL/BL with LRS cells $$V_4 = V_{WL} - V_{BL}$$

The amount of cells of each type is evaluated for power purposes, and therefore, it would be sufficient to simplify and assume that the number of cells in I-IRS is equal to those in LRS (III) Bernoulli-1/2 distribution with randomizer). Therefore, write SET addresses of half the wordline cells:

$$G(V_1) = G(V_3) = \frac{1}{2} N$$

$$G(V_2) = G(V_4) = \frac{1}{2} N(M-1)$$

C. Optimization for Minimum Average Disturb and Power

Average voltage disturbs over unwanted cells and power consumption are correlated, hence both can be optimized by minimizing the redundant power. The power function with set S of voltage types I to IV and the calculated affected cells is:

$$P_U(S) = \sum_{V_{Ui} \in S} (V_{Ui}^2 \cdot G(V_{Ui})) =$$

$$\frac{N}{2} V_{PP}^2 + \frac{N(M-1)}{2} V_{WL}^2 + \frac{N}{2} (V_{PP} - V_{BL})^2 + \frac{N(M-1)}{2} (V_{WL} - V_{BL})^2$$

The power function should be minimized subject to constraints that $V_1$ to $V_4$ do not exceed $V_{PEAK}$ or below $-V_{PEAK}$:

$$\begin{cases} -V_{PEAK} \leq V_{WL} \leq V_{PEAK} \\ -V_{PEAK} \leq V_{PP} - V_{BL} \leq V_{PEAK} \\ -V_{PEAK} \leq V_{WL} - V_{BL} \leq V_{PEAK} \end{cases}$$

Optimization of the given function is performed by finding maxima/minima points:

$$\frac{\partial P_U}{\partial V_{WL}} = N(M-1)V_{WL} + N(M-1)(V_{WL} - V_{BL})$$

Equalizing the derivation by $V_{WL}$ to zero, results in:

$$V_{WL} = \frac{V_{BL}}{2}$$

Same analysis for the derivation by $V_{BL}$ results in:

$$\frac{\partial P_U}{\partial V_{BL}} = N(V_{PP} - V_{BL}) - N(M-1)(V_{WL} - V_{BL})$$

Again, equalizing the derivation by $V_{BL}$ to zero, results in:

$$V_{BL} = \frac{(M-1)V_{WL} + V_{PP}}{M}$$

The extremum point:

$$V_{BL} = \frac{2}{M+1}V_{PP}$$

$$V_{WL} = \frac{1}{M+1}V_{PP}$$

The analysis of the extremum type is:

$$\frac{\partial P_U}{\partial V_{WL} \partial V_{BL}} = -N(M-1)$$

$$\frac{\partial^2 P_U}{\partial V_{WL}^2} = 2N(M-1)$$

$$\frac{\partial^2 P_U}{\partial V_{BL}^2} = N(M-1) + N = NM$$

$$\frac{\partial^2 P_U}{\partial V_{WL}^2} \cdot \frac{\partial^2 P_U}{\partial V_{BL}^2} - \left(\frac{\partial P_U}{\partial V_{WL} \partial V_{BL}}\right)^2 = N^2(M^2 - 1) > 0$$

Therefore the point is not a saddle and is either maximum or minimum.
Since $$\frac{\partial^2 P_U}{\partial V_{WL}^2} > 0 \text{ and } \frac{\partial^2 P_U}{\partial V_{BL}^2} > 0$$

(M,N are integers larger than 1) it is a minimum.

The value of M is expected to be large and may shift the optimal point out of constrained peak values. Parameterizing $V_{PEAK}$ to α a fraction of $V_{PP}$:

$$V_{PEAK} = \alpha V_{PP}$$

Would result in corresponding constraints:

$$-\alpha \leq \frac{1}{M+1} \leq \alpha \text{ and } -\alpha \leq \frac{M-1}{M+1} \leq \alpha$$

The requirement of $$\frac{M-1}{M+1} \leq \alpha$$

with a large M would require a peak voltage that is close to $V_{PP}$ and the current optimization may change the resistance of neighbor cells. However, the requirement of $-V_{PEAK} \leq V_{PP} - V_{BL} \leq V_{PEAK}$ holds for cells in the same wordline that are meant to be written to HRS during RESET. Therefore, disturb on those cells can be tolerated in the SET phase, since the consecutive write step will correct it.

The following RESET phase voltages have to be re-optimized since it cannot tolerate disturbs. Unselected WL and BL voltages depend on an $\alpha V_{PP}$ value. We analyze the power function based on α to obtain the coefficients $C_{WL}$ and $C_{BL}$ which would be multiplied by $V_{PP}$ to obtain the optimal unselected WL and BL voltages:

$$V_{BL} = C_{BL}(\alpha)V_{PP}$$

$$V_{WL} = C_{WL}(\alpha)V_{PP}$$

Results of the constrained optimization are:

$$C_{BL}(\alpha) = \begin{cases} 0.9965 - 0.9934\alpha & \alpha \geq 1/3 \\ 0 & \text{else} \end{cases}$$

$$C_{WL}(\alpha) = \begin{cases} 0.4982 - 0.4967\alpha & \alpha \geq 1/3 \\ 0 & \text{else} \end{cases}$$

Figure 3:
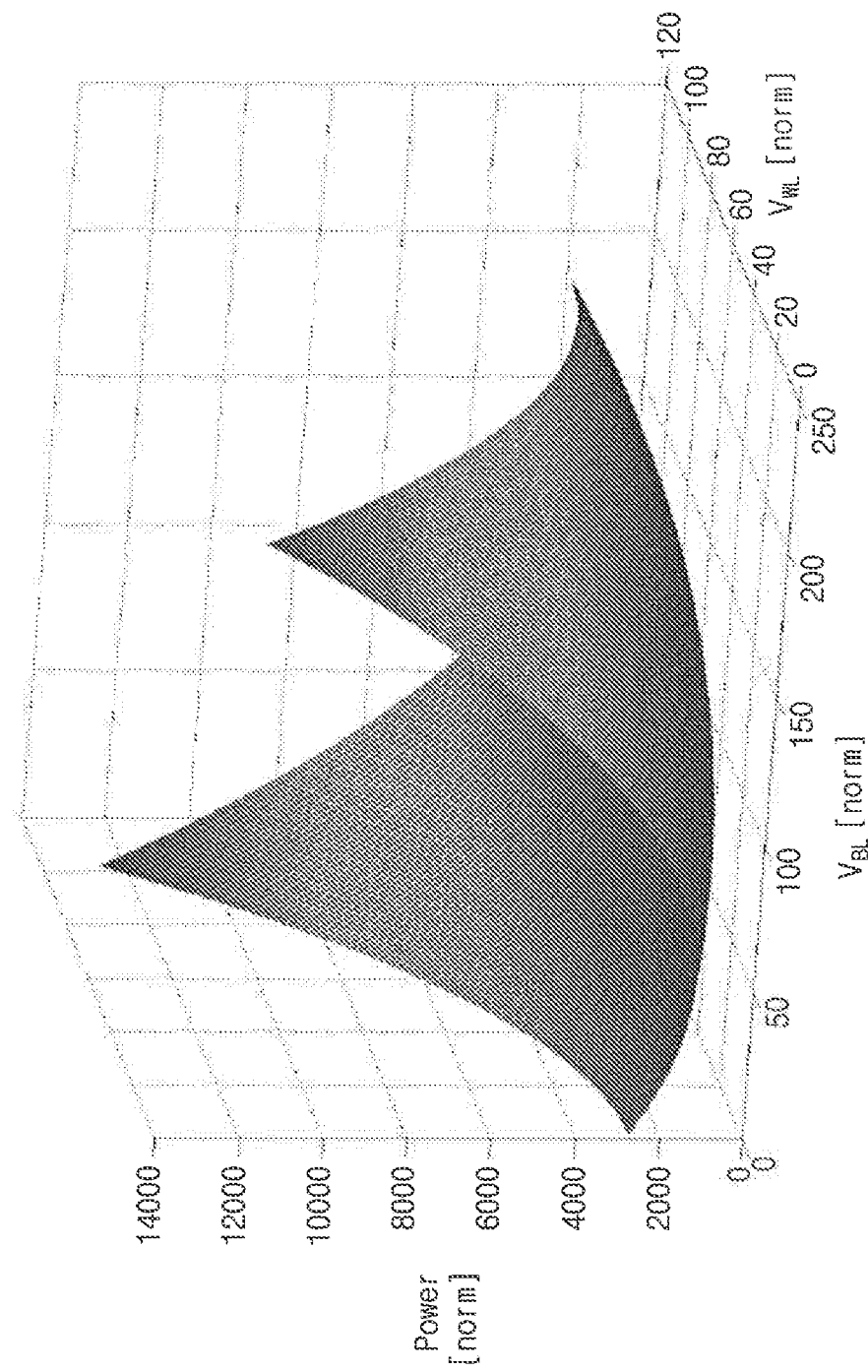
FIG. 3 illustrates a power function computing in accordance with an exemplary embodiment of the inventive concept versus unselected wordline and bitline voltages.

FIG. 3 illustrates a power function ($P_U$) versus unselected WL/BL voltages α=½.

Figure 4A:
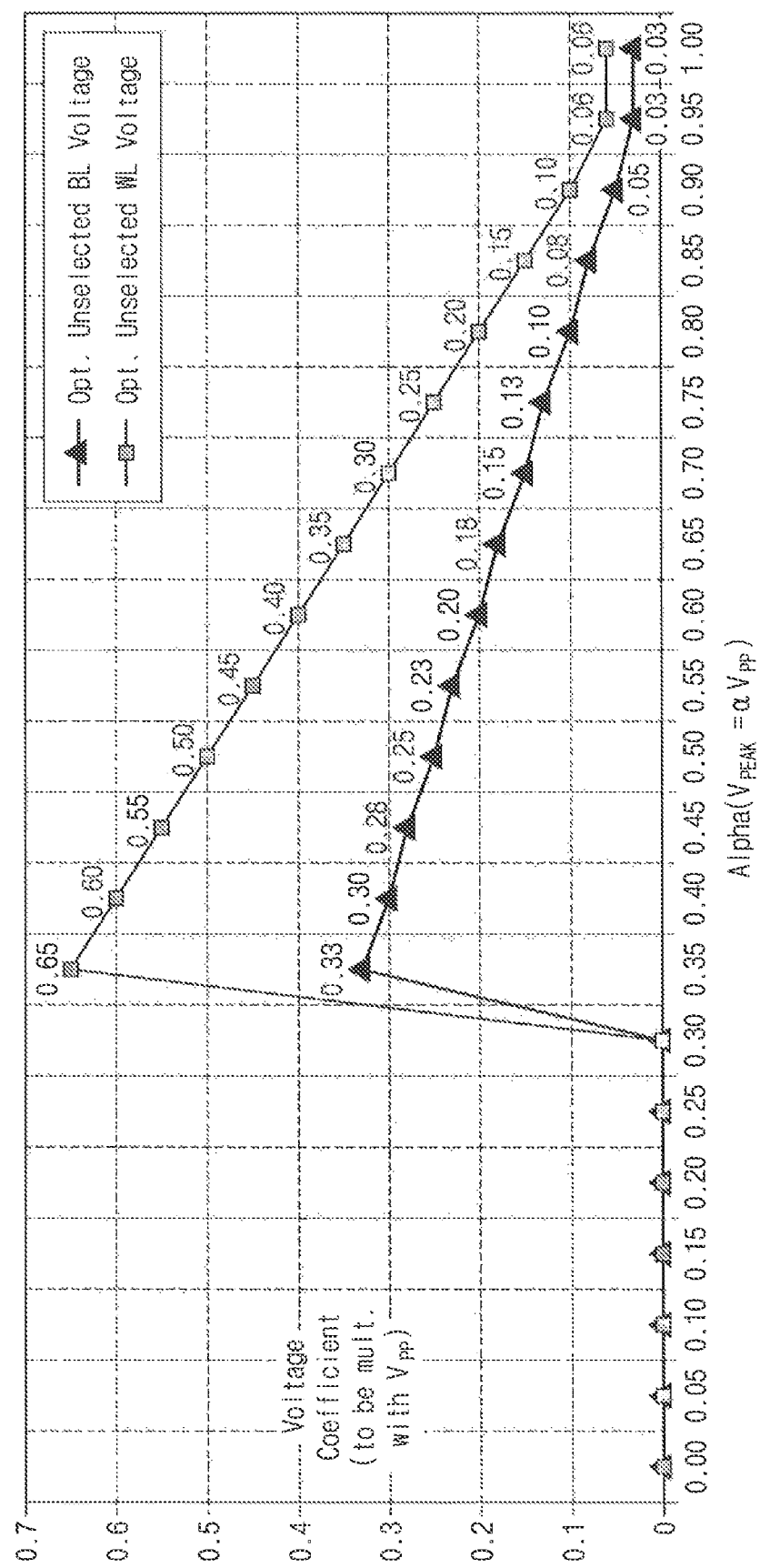
FIG. 4A illustrates optimization results for minimum average disturbs and power consumption, according to an exemplary embodiment of the inventive concept.

Optimization results are verified by simulation and are depicted in FIGS. 4A and 4B. For example, if write voltage $V_{PP}$=1[V], $V_{PEAK}$=$V_{PP}$/2, the corresponding voltages are $V_{WL}$=$C_{WL}$=0.5[V] and $V_{BL}$=$C_{BL}$=0.25 [V].

More specifically, FIG. 4A illustrates optimization results for minimum average disturbs and power consumption, according to an exemplary embodiment of the inventive concept. The graph of FIG. 4A shows the optimal voltage coefficients for unselected WLs and BLs during a write operation versus Alpha. It is can be seen that given the constraint of $V_{PEAK}$<α$V_{PP}$, the desired voltages are zero. The values have to be multiplied by $V_{PP}$ for nominal voltage. For example, if $V_{PP}$=2V, $V_{PEAK}$=1V, then unselected $V_{WL}$=1V and $V_{BL}$=0.5V.

Figure 5A:
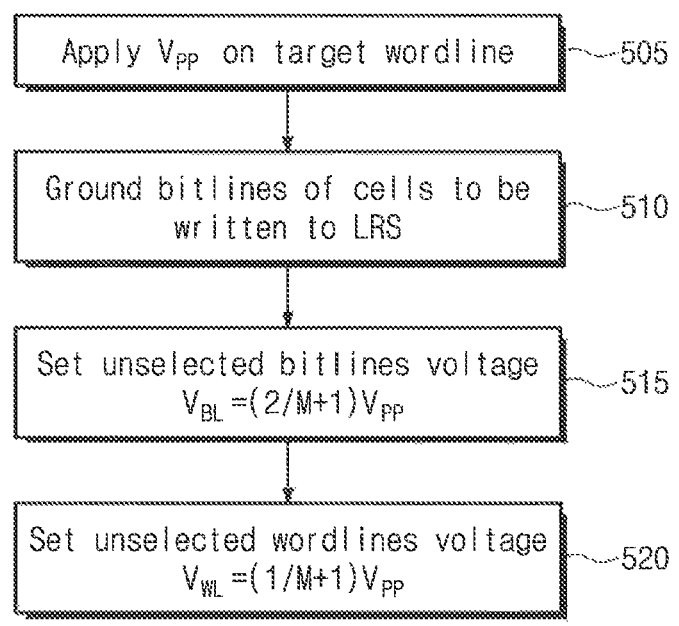
FIGS. 5A and 5B illustrate a write scheme that minimizes the average voltage disturb and power, according to an exemplary embodiment of the inventive concept.
Figure 5B:
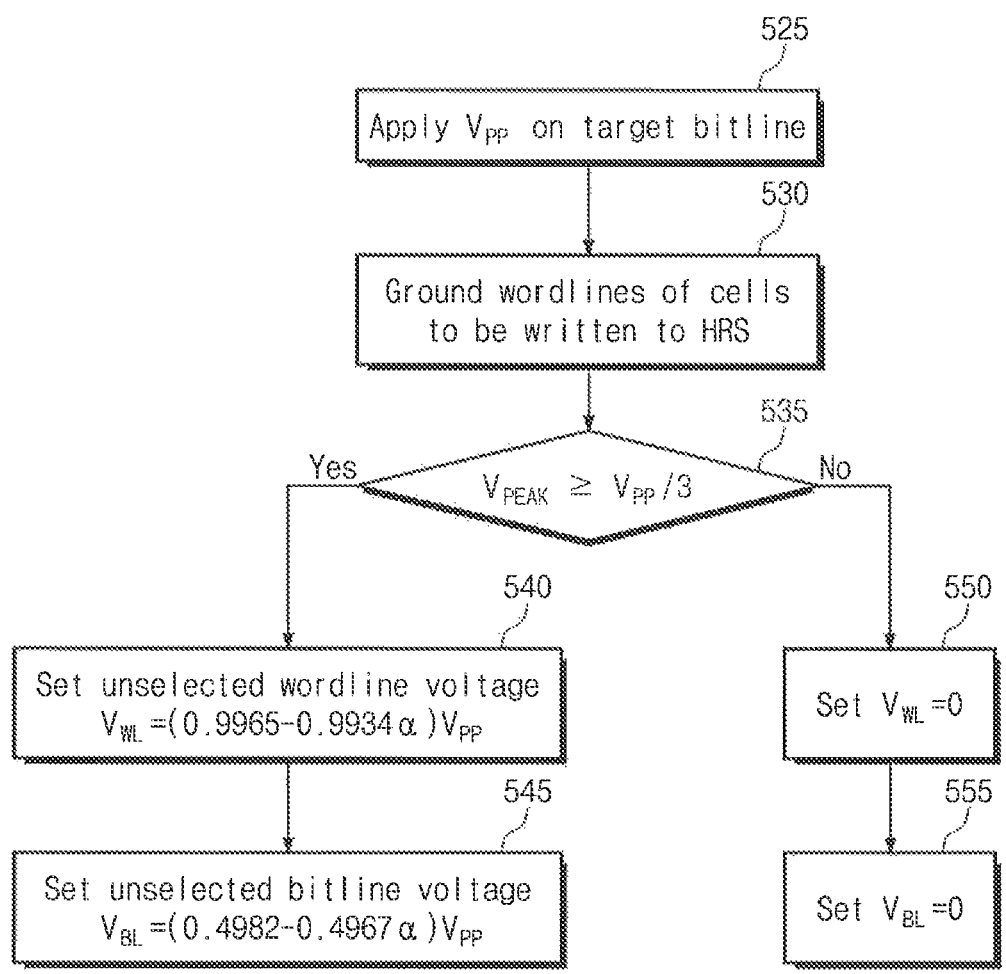

The write scheme that minimizes the average voltage disturb and power according to an exemplary embodiment of the inventive concept is illustrated in FIGS. 5A and 5B.

FIG. 5A illustrates a SET phase of the write scheme. As shown in FIG. 5A, $V_{PP}$ is applied to a target wordline (505), and bitlines of cells to be written to LRS are grounded (510). Next, unselected bitlines voltages are set to $$V_{BL} = \frac{2}{M+1}V_{PP}(515),$$

and unselected wordlines voltages are set to $$V_{WL} = \frac{1}{M+1}V_{PP}(520).$$

FIG. 5B illustrates a RESET phase of the write scheme. As shown in FIG. 5B, $V_{PP}$ is applied to a target bitline (525), and wordlines of cells to be written to HRS are grounded (530). Then, it is determined if $V_{PEAK} \geq V_{PP}/3$ (535). If $V_{PEAK} \geq V_{PP}/3$, the unselected wordlines voltage is set to $V_{WL}$=(0.9965−0.9934α)$V_{PP}$ (540). In addition, if $V_{PEAK} \geq V_{PP}/3$, the unselected bitlines voltage is set to $V_{BL}$=(0.4982−0.4967α)$V_{PP}$ (545). In the event that $V_{PEAK}$ is not $\geq V_{PP}/3$, the unselected wordlines voltage is set to zero (550) and the unselected bitlines voltage is set to zero (555).

D. Optimization for Minimum Peak Disturb

The minimal peak disturb approach is provided to reduce $V_{MD}(S)$ as much as possible. As $V_{MD}(S)$ depends on the set of voltages S, the following constrained optimization is considered:

$$\min(|V_{WL}|, |V_{PP} - V_{BL}|, |V_{WL} - V_{BL}|)$$

Subject to:

$$\begin{cases} -\alpha V_{PP} \leq V_{WL} \leq \alpha V_{PP} \\ -\alpha V_{PP} \leq V_{PP} - V_{BL} \leq \alpha V_{PP} \\ -\alpha V_{PP} \leq V_{WL} - V_{BL} \leq \alpha V_{PP} \end{cases}$$

The solution depends on the voltage of α. If α<⅓, there do not exist WL/BL voltages that satisfy the constraints. If α≥⅓, the solution is:

$$V_{WL} = \frac{1}{3} V_{PP}$$

$$V_{BL} = \frac{2}{3} V_{PP}$$

In this case $$V_{MD}(S) = \frac{1}{3} V_{PP}.$$

We now observe that peak disturb is not required in cells of type III, $-\alpha V_{PP} \leq V_{PP} - V_{BL} \geq \alpha V_{PP}$ during the SET phase, since those would be changed to HRS during reset. Therefore, we can reduce write disturb to zero in all cells that are not on the target wordline during the SET operation and use the above-described voltage optimization for the RESET phase. In this scheme, the write disturb can be reduced by 50%.

Figure 6:
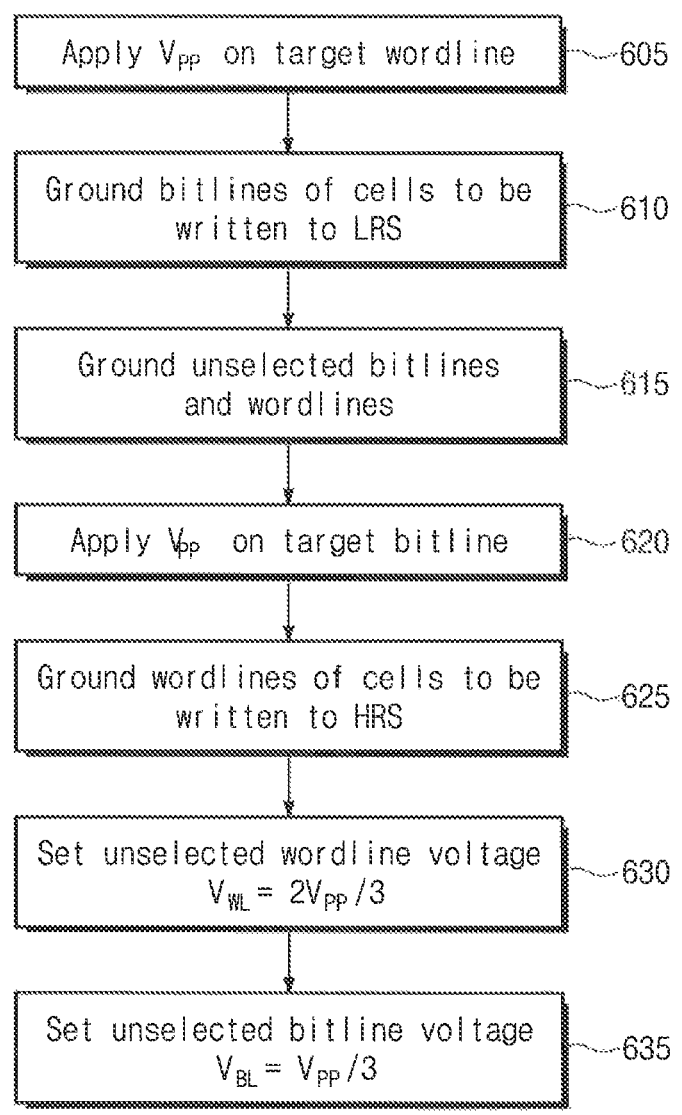
FIG. 6 illustrates a write process for minimal park disturb per cell, according to an exemplary embodiment of the inventive concept.

The write process for minimal perk disturb per cell according to an exemplary embodiment of the inventive concept is illustrated in FIG. 6.

As shown in FIG. 6, in a SET phase: $V_{PP}$ is applied to a target wordline (605), bitlines of cells to be written to LRS are grounded (610), and unselected wordlines and bitlines are grounded (615). In a RESET phase: $V_{PP}$ is applied to a target bitline (620), wordlines of cells to be written to HRS are grounded (625), unselected wordlines voltages are set to $V_{WL}=2V_{PP}/3$ (630) and unselected bitlines voltages are set to $V_{BL}=V_{PP}/3$ (635).

Gain Analysis and Implementations

Hereinafter, the write schemes discussed above and illustrated in FIGS. 5A, 5B and 6 will be compared to conventional write schemes. The write scheme of FIGS. 5A and 5B will be referred to as Algorithm 1 and the write scheme of FIG. 6 will be referred to as Algorithm 2.

For comparison in power consumption, we used Algorithm 1 with σ=½ for peak write disturb $V_{PP}/2$ (same as V/2 scheme) and Algorithm 2 has a peak of $V_{PP}/3$ (similar to V/3 scheme) but it is only applied at the RESET phase. Power was calculated as described in the Electric Model of Write Operation section above.

Figure 7:
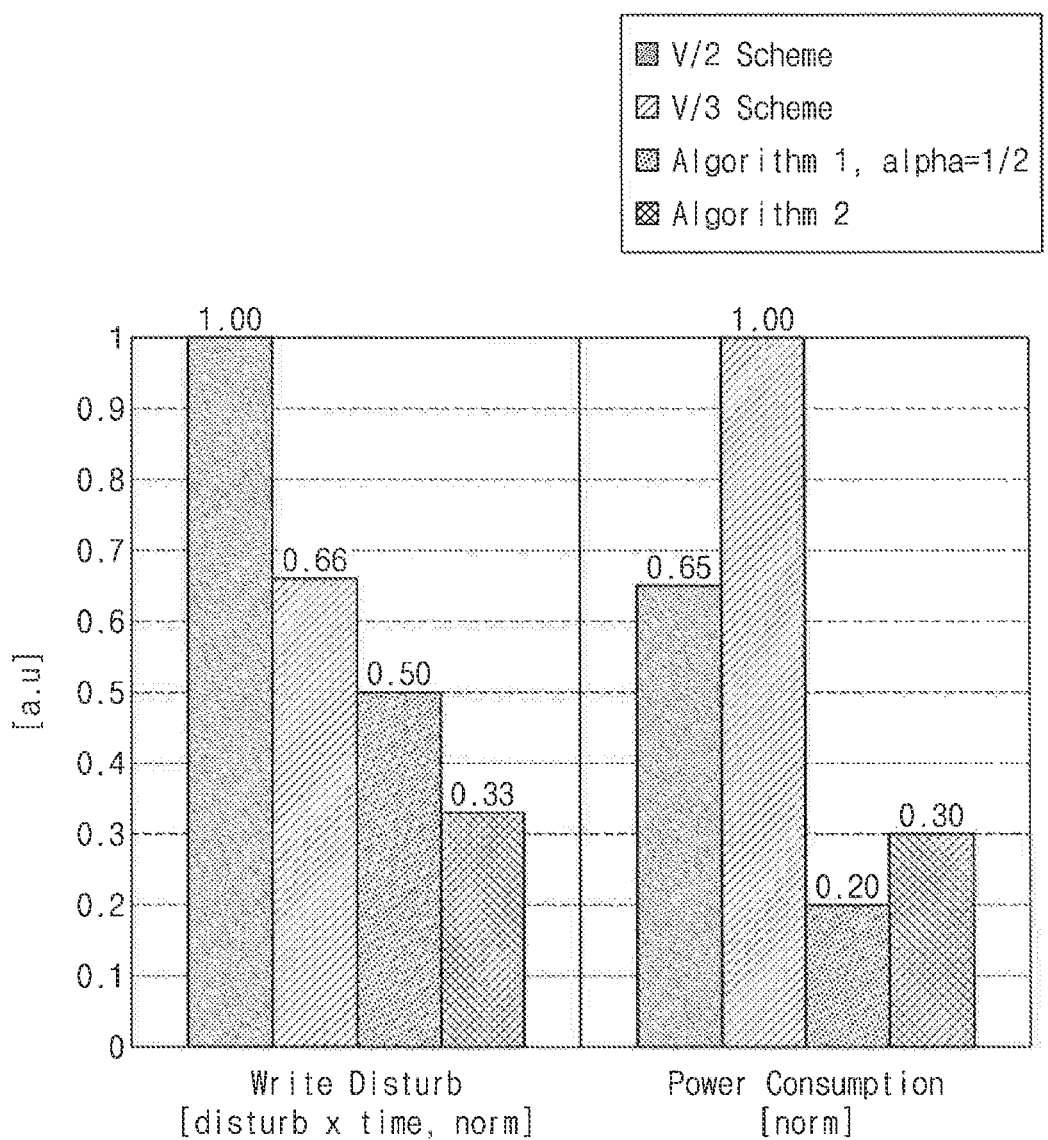
FIG. 7 illustrates gain analysis results of algorithms 1 and 2 according to exemplary embodiments of the inventive concept compared to conventional write schemes of V/2 and V/3.

Results are depicted in FIG. 7. In reference to FIG. 7, we can observe that Algorithm 1 with α=½ has 50% and 25% reduction in write disturb and 70% and 80% power reduction comparing to V/2 and V/3 write schemes, respectively. Analysis of algorithm 2 shows 66% and 50% less write disturb and 55% and 70% less power regarding V/2 and V/3 schemes. The gain difference from the conventional schemes is presented in FIG. 8.

Implementation of Algorithms 1 and 2 requires support of a WL/BL voltage regulator in a power supply chip module. Algorithms 1 and 2 also require proper program software at the chip embedded microcontroller to manage the write operation.

Figure 9:
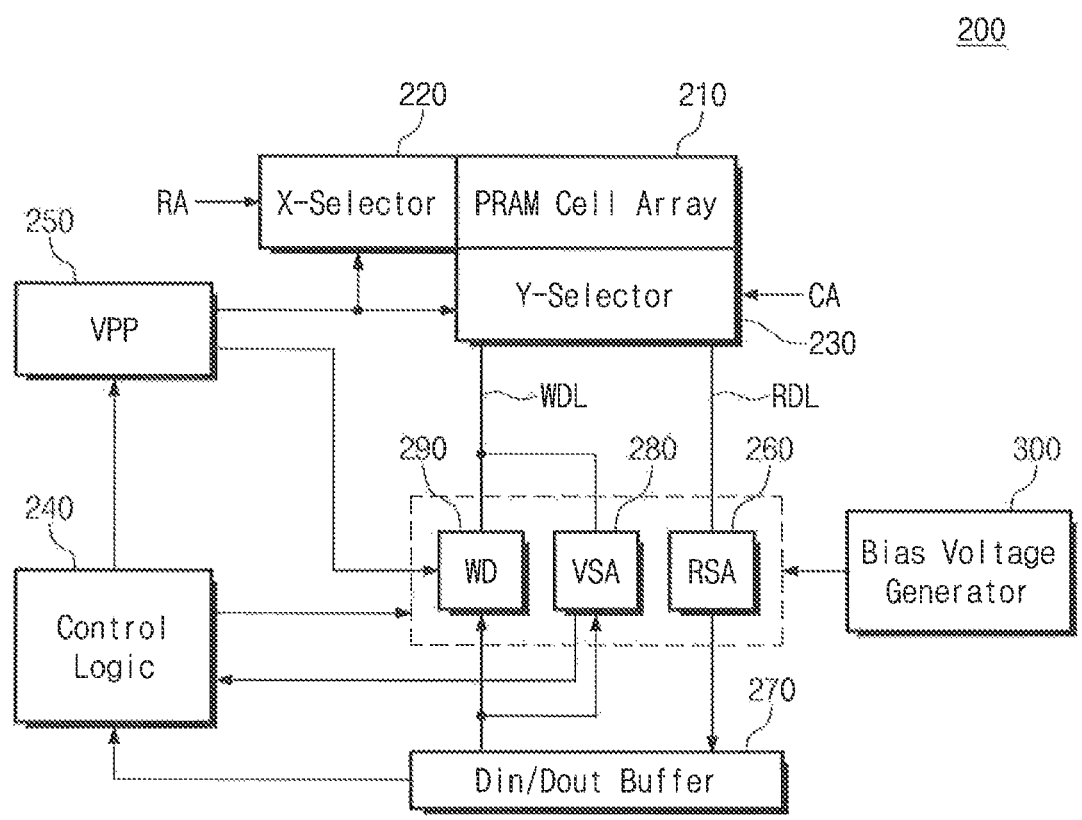
FIG. 9 is a block diagram illustrating a phase change memory device according to an exemplary embodiment of the inventive concept.

FIG. 9 is a block diagram illustrating a phase change memory device according to an exemplary embodiment of the inventive concept.

Examples of phase change memory devices and systems for use in accordance with exemplary embodiments of the inventive concept are described in U.S. Pat. No. 8,134,866 entitled "Phase Change Memory Devices and Systems, and Related Programming Methods," the disclosure of which is incorporated by reference herein in its entirety.

Referring to FIG. 9, a phase change memory device 200 comprises a memory cell array 210 wherein each memory cell stores N-bit data (N is an integer greater than 0). Although not shown in detail in FIG. 9, memory cell array 210 comprises a plurality of rows corresponding to word lines and columns corresponding to bit lines, and memory cells arranged in a matrix at intersections between the bit lines and word lines.

Each of the memory cells in memory cell array 210 typically comprises a switching device and a resistor. In general, the switching device may be embodied by various elements such as a metal-oxide semiconductor (MOS) transistor or a diode. In addition, each memory cell in memory cell array 210 is an over-writable memory cell. Examples of memory cells that could be used in memory cell array 210 are described in U.S. Pat. No. 6,928,022 entitled "Write Drive Circuit in Phase Change Memory Device and Method for Applying Write Current", U.S. Pat. No. 6,967,865 entitled "Low-Current and High-Speed Phase-Change Memory Devices and Methods of Driving The Same", and U.S. Pat. No. 6,982,913 entitled "Data Read Circuit for Use in a Semiconductor Memory and a Memory Thereof". The respective disclosures of these patents are hereby incorporated by reference.

A row select circuit 220 selects at least one word line among the plurality of word lines in response to a row address RA, and a row select circuit 230 selects a subset of the plurality of bit lines in response to a column address CA. A control logic unit 240 is configured to control overall operations of phase change memory device 200 in response write/read commands from an external source. A high voltage generating circuit 250 is controlled by control logic unit 240, and is configured to generate a high voltage used by row and column select circuits 220 and 230 and a write driver circuit 290. For example, high voltage generating circuit 250 may comprise a charge pump. However, those skilled in the art will recognize that high voltage generating circuit 250 could be embodied by a variety of other elements besides a charge pump.

A first sense amplifier circuit 260, labeled RSA, is controlled by control logic unit 240, and senses cell data through bit lines selected by column select circuit 230 in a normal read operation. The sensed data is output via a data input/output buffer circuit 270. First sense amplifier circuit 260 is connected to a data bus RDL and applies sense current I_SENSE to data bus RDL in the normal read operation. A second sense amplifier circuit 280, labeled VSA, is also controlled by control logic unit 240 and senses cell data through the bit lines selected by column select circuit 230 using program data stored in data input/output buffer circuit 270 during the verify read operation. Second sense amplifier circuit 280 variably applies verify current I_SET or I_RE- SET to the selected bit lines according to program data temporarily stored in data input/output buffer circuit 270.

Cell data sensed by second sense amplifier circuit 280 is applied to control logic unit 240. Control logic unit 240 determines whether or not the cell data sensed by second sense amplifier circuit 280 is identical to the program data stored in data input/output circuit 270. Control logic unit 240 controls write driver circuit 290 according a result of this determination. For instance, where the program data is determined to be identical to the sensed data, control logic unit 240 does not generate set and reset pulse signals corresponding to program data. On the other hand, where the program data value is determined not to be identical to the sensed data, control logic unit 240 generates set and reset pulse signals corresponding to the program data, or in other words, a program loop is repeated.

With each repetition of the program loop, control logic unit 240 controls write drive circuit 290 such an amount of a write current I_SET_W or I_RESET_W applied to selected bit lines in the program loop increases or decreases gradually. A bias voltage generating circuit 300 is controlled by control logic unit 240, and is configured to generate bias voltages to be applied to first and second sense amplifier circuits 260 and 280 and write driver circuit 290, respectively.

The phase change memory device 200 may be part of a memory system that includes a memory controller.

The memory controller may include a microprocessor, a read-only memory (ROM), a random access memory (RAM), a memory interface, and a bus. The elements of the memory controller may be electrically connected to each other through the bus.

The microprocessor controls the overall operation of the memory system including the memory controller. The microprocessor is a circuit that controls other elements by generating control signals. When power is supplied to the memory system, the microprocessor drives firmware (e.g., stored in the ROM) for operating the memory system on the RAM, thereby controlling the overall operation of the memory system. According to an exemplary embodiment of the inventive concept, the microprocessor may also issue instructions for controlling operations of other elements of the memory controller including, for example, some or all of the ROM, RAM, memory interface, and a bus. According to an exemplary embodiment of the inventive concept, any operations described herein as being performed by the memory controller may be performed by, or under the control of, the microprocessor. According to an exemplary embodiment of the inventive concept, any operations described herein as being performed by the memory controller may be performed by, or under the control of, the microprocessor executing instructions that correspond to the operations and are included in program code (e.g., stored in the ROM).

While a driving firmware code of the memory system is stored in the ROM, exemplary embodiments of the inventive concept are not limited thereto. The firmware code can also be stored in a portion of the memory device 200 other than the ROM. Therefore, the control or intervention of the microprocessor may encompass not only the direct control of the microprocessor but also the intervention of firmware which is software driven by the microprocessor.

The RAM, which is a memory serving as a buffer, may store an initial command, data, and various variables input from a host or the microprocessor, or data output from the memory device 200. The RAM may store data and various parameters and variables input to and output from the memory device 200.

The memory interface may serve as an interface between the memory controller and the memory device 200. The memory interface is connected to an I/O pad of the memory device 200 and may exchange data with the I/O pad. In addition, the memory interface may create a command suitable for the memory device 200 and provide the created command to the I/O pad of the memory device 200. The memory interface provides a command to be executed by the memory device 200 and an address of the memory device 200.

It is to be understood that the above described methods of the inventive concept may be carried out by one or more of the above described elements of the controller and memory device 200.

It is to be further understood that components described herein and illustrated in drawings may be implemented with software, hardware, or a combination thereof, for example. In an exemplary embodiment of the inventive concept, the software may be a machine code, firmware, an embedded code, and application software. For example, the hardware may include an electrical circuit, an electronic circuit, a processor, a computer, an integrated circuit, integrated circuit cores, or a combination thereof.

The write schemes discussed above and illustrated in FIGS. 5A, 5B and 6 addressed single-level cell (SLC) architecture. It is to be understood, however, that their adaptation to multi-level cell (MLC), either 4 or 8 levels or any other, is straightforward by supplying the relevant voltages, and other multi-phase scenarios such as RESET-before-SET or any composition that considers the write time in addition to voltage magnitude.

CONCLUSIONS

PRAMs have to be packed in an efficient array structure in order to reflect device behavior in a product specification. In data storage applications, cost-per-bit is very important, and currently the densest topology is with cross-point array structures.

Although cross-point structures achieve competitive cell size, they have drawbacks. One shortcoming is the cell disturb and redundant power dissipation during write operation. Disturbs are the voltage drops over cells which were meant to remain in their resistance state, and may cause data errors. Redundant power is consumed by parasitic currents and limits the array size, thus blocking the cross-point array from achieving its density potential.

Optimizing the write process has inherent conflicts. Setting low peak write disturb by certain voltage configurations limits cell's resistance change and prevents errors, but causes increased redundant power consumption that dissipates in cells that are not involved in the write mechanism. The other aspect of the matter is that using other sets for voltages to reduce power may result in more disturbs and thus harm data integrity.

In this disclosure, we presented two novel write algorithms that achieve better characteristics that conventional write schemes. In both of the write algorithms, we observe that write has at least two time phases with different voltages, and consequently disturbs in cells on the same wordline in the first phase will be corrected in the second one. Therefore, the early step is optimized for power reduction. In the first algorithm, we modeled PRAM cross-point topology and explored optimal voltages for minimal power. The second algorithm was constrained to peak disturb. Analysis shows that the write algorithms achieve up to 66% less disturb and 80% lower power than the conventional write schemes.

The novel write algorithms presented herein enable PRAM array size to be enlarged and PRAM reliability to be enhanced.

While the present inventive concept has been described with reference to exemplary embodiments thereof, it will be apparent to those skilled in the art that various changes and modifications may be made thereto without departing from the spirit and scope of the present inventive concept as defined by the attached claims.

What is claimed is:

1. A method for writing memory cells in a nonvolatile memory device comprising wordlines overlapping bitlines, the method comprising:
in a first phase:
applying a program pulse voltage to a target wordline;
grounding bitlines of memory cells to be written to a first resistance state;
setting a bitline voltage of unselected bitlines; and
setting a wordline voltage of unselected wordlines;
in a second phase:
applying the program pulse voltage to a target bitline;
grounding wordlines of the memory cells to be written to a second resistance state;
setting the wordline voltage of the unselected wordlines to a first value if a peak of a maximum voltage drop over memory cells which were not meant to be changed is greater than or equal to a second value, and setting the wordline voltage to zero if the peak of the maximum voltage drop is not greater than or equal to the second value; and
setting the bitline voltage of the unselected bitlines to a third value if the peak of the maximum voltage drop is greater than or equal to the second value, and setting the bitline voltage to zero if the peak of the maximum voltage drop is not greater than or equal to the second value.

2. The method of claim 1, wherein the first phase is a set phase and the second phase is a reset phase.

3. The method of claim 1, wherein the nonvolatile memory device is phase-change random access memory.

4. The method of claim 1, wherein the first resistance state is a low resistance state the second resistance state is a high resistance state.

5. The method of claim 1, wherein the wordlines and the bitlines form an M×N array, wherein M and N are each integers greater than one, and wherein the bitline voltage of the unselected bitlines is represented by $$V_{BL} = \frac{2}{M+1} V_{PP},$$

where $V_{BL}$ is the bitline voltage of the unselected bitlines and $V_{PP}$ is the program pulse voltage.

6. The method of claim 1, wherein the wordlines and the bitlines form an M×N array, wherein M and N are each integers greater than one, and wherein the wordline voltage of the unselected wordlines is represented by $$V_{WL} = \frac{1}{M+1} V_{PP},$$

where $V_{WL}$ is the wordline voltage of the unselected wordlines and $V_{PP}$ is the program pulse voltage.

7. The method of claim 1, wherein the first value is $(0.9965-0.9934^\alpha)$ multiplied by the program pulse voltage, wherein α is a value between zero and one.

8. The method of claim 7, wherein the third value is $(0.4982-0.4967^\alpha)$ multiplied by the program pulse voltage, wherein α is a value between zero and one.

9. The method of claim 8, wherein the second value is the program pulse voltage divided by 3.

10. A method for writing memory cells in a nonvolatile memory device comprising wordlines overlapping bitlines, the method comprising:
in a first phase:
applying a program pulse voltage to a target wordline;
grounding bitlines of memory cells to be written to a first resistance state;
grounding unselected bitlines and unselected wordlines;
in a second phase:
applying the program pulse voltage to a target bitline;
grounding wordlines of the memory cells to be written to a second resistance state;
setting a wordline voltage of unselected wordlines; and
setting a bitline voltage of unselected bitlines.

11. The method of claim 10, wherein the first phase is a set phase and the second phase is a reset phase.

12. The method of claim 10, wherein the nonvolatile memory device is phase-change random access memory.

13. The method of claim 10, wherein the first resistance state is a low resistance state the second resistance state is a high resistance state.

14. The method of claim 10, wherein the wordline voltage is represented by $$V_{WL} = \frac{2V_{PP}}{3},$$

where $V_{WL}$ is the wordline voltage of the unselected wordlines in the second phase and $V_{PP}$ is the program pulse voltage.

15. The method of claim 10, wherein the bitline voltage is represented by $$V_{BL} = \frac{V_{PP}}{3},$$

where $V_{BL}$ is the bitline voltage of the unselected bit lines in the second phase and $V_{PP}$ is the program pulse voltage.

16. A method for writing memory cells in a nonvolatile memory device comprising wordlines overlapping bitlines, the method comprising:
applying a program pulse voltage to a target wordline;
grounding bitlines of memory cells to be written to a first resistance state;
setting a bitline voltage of unselected bitlines;
setting a wordline voltage of unselected wordlines;
applying the program pulse voltage to a target bitline;
grounding wordlines of the memory cells to be written to a second resistance state; and
setting the wordline voltage of the unselected wordlines to a first value if a peak maximum voltage drop of memory cells which were not meant to be changed is greater than or equal to a second value.

17. The method of claim 16, further comprising setting the wordline voltage to zero if the peak maximum voltage drop is not greater than or equal to the second value.

18. The method of claim 16, further comprising:
setting the bitline voltage of the unselected bitlines to a third value if the peak maximum voltage drop is greater than or equal to the second value.

19. The method of claim 17, further comprising setting the bitline voltage to zero if the peak maximum voltage drop is not greater than or equal to the second value.

20. The method of claim 16, wherein the nonvolatile memory device is phase-change random access memory.

* * * * *